(12) United States Patent
Chistyakov

(10) Patent No.: US 6,903,511 B2
(45) Date of Patent: Jun. 7, 2005

(54) GENERATION OF UNIFORMLY-DISTRIBUTED PLASMA

(75) Inventor: Roman Chistyakov, Andover, MA (US)

(73) Assignee: Zond, Inc., Mansfield, MA (US)

( * ) Notice: Subject to any disclaimer, the term of this patent is extended or adjusted under 35 U.S.C. 154(b) by 0 days.

(21) Appl. No.: 10/249,774

(22) Filed: May 6, 2003

(65) Prior Publication Data

US 2004/0222745 A1 Nov. 11, 2004

(51) Int. Cl.[7] .................. H01J 7/24; C23C 14/00
(52) U.S. Cl. .................. 315/111.71; 315/111.91; 204/298.37
(58) Field of Search ............. 315/111.71, 111.91, 315/111.81, 111.41, 111.21; 204/192, 298

(56) References Cited

U.S. PATENT DOCUMENTS

| | | | |
|---|---|---|---|
| 3,619,605 A | 11/1971 | Cook et al. ............... 250/41.9 |
| 4,060,708 A | 11/1977 | Walters ..................... 219/121 |
| 4,148,612 A | 4/1979 | Taylor et al. .............. 23/232 |
| 4,546,253 A | 10/1985 | Tsuchiya et al. ........... 250/288 |
| 4,703,222 A | 10/1987 | Yoshikawa et al. ........ 313/362.1 |
| 4,792,725 A | 12/1988 | Levy et al. ................ 315/39 |
| 4,802,183 A | 1/1989 | Harris et al. .............. 372/57 |
| 4,919,690 A | 4/1990 | Lovelock .................. 55/2 |
| 4,953,174 A | 8/1990 | Eldridge et al. ........... 372/87 |
| 5,015,493 A | 5/1991 | Gruen ...................... 427/38 |
| 5,083,061 A | 1/1992 | Koshiishi et al. .......... 315/111.81 |
| 5,247,531 A | 9/1993 | Muller-Horsche .......... 372/38 |
| 5,247,535 A | 9/1993 | Muller-Horsche et al. .... 372/86 |
| 5,286,360 A | 2/1994 | Szczyrbowski et al. ..... 204/298.08 |
| 5,382,457 A | 1/1995 | Coombe ................... 427/596 |
| 5,506,405 A | 4/1996 | Yoshida et al. ........... 250/251 |
| 5,733,418 A | 3/1998 | Hershcovitch et al. . 204/192.11 |
| 5,821,548 A | 10/1998 | Hinchliffe ................ 250/492.21 |
| 6,057,244 A | 5/2000 | Hausmann et al. ........ 438/706 |
| 6,124,675 A | 9/2000 | Bertrand et al. .......... 315/111.91 |
| 6,207,951 B1 | 3/2001 | Yamauchi et al. ......... 250/251 |
| 6,296,742 B1 | 10/2001 | Kouznetsov .............. 204/192.12 |
| 6,395,641 B2 | 5/2002 | Savas ...................... 438/714 |
| 6,413,382 B1 | 7/2002 | Wang et al. .............. 204/192.12 |
| 6,413,383 B1 | 7/2002 | Chiang et al. ............ 204/192.13 |
| 2002/0153103 A1 | 10/2002 | Madocks ................. 156/345.46 |
| 2004/0075060 A1 * | 4/2004 | Luten et al. .............. 250/423 R |

FOREIGN PATENT DOCUMENTS

WO WO 98/40532 9/1998
WO WO 01/98553 A1 12/2001

OTHER PUBLICATIONS

Booth, et al., The Transition From Symmetric To Asymemtric Discharges In Pulsed 13.56 MHz Capacitively Coupled Plasmas, J. Appl. Phys., Jul. 15, 1997, pp. 552–560, vol. 82, No. 2, American Institute of Physics.

Bunshah, et al., Deposition Technologies For Flims And Coatings, pp. 178–183, Noyes Publications, Park Ridge, New Jersey.

(Continued)

Primary Examiner—Tuyet Thi Vo
(74) Attorney, Agent, or Firm—Kurt Rauschenbach; Rauschenbach Patent Law Group, LLC

(57) ABSTRACT

Methods and apparatus for generating uniformly-distributed plasma are described. A plasma generator according to the invention includes a cathode assembly that is positioned adjacent to an anode and forming a gap there between. A gas source supplies a volume of feed gas and/or a volume of excited atoms to the gap between the cathode assembly and the anode. A power supply generates an electric field across the gap between the cathode assembly and the anode. The electric field ionizes the volume of feed gas and/or the volume of excited atoms that is supplied to the gap, thereby creating a plasma in the gap.

50 Claims, 7 Drawing Sheets

OTHER PUBLICATIONS

Daugherty, et al., Attachment–Dominated Electron–Beam Ionized Discharges, Applied Physics Letters, May 15, 1976, pp. 581–583, vol. 28, No. 10, American Institue of Physics.

Goto, et al., Dual Excitation Reactive Ion Etcher For Low Energy Plasma Processing, J. Vac. Sci. Technol. A., Sep./Oct. 1992. pp. 3048–3054, vol. 10, No. 5, American Vacuum Society.

Kouznetsov, et al., A Novel Pulsed Magnetron Sputter Technique Utilizing Very High Target Power Densities, Surface and Coatings Technology, 1999, pp. 290–293, vol. 122, Elsevier Science S.A.

Lindquist, et al., High Selectivity Plasma Etching Of Silicone Dioxide With A Dual Frequency 27/2 MHz Capacitive RF Discharge.

MaCak, Reactive Sputter Deposition Process Of A1203 And Characterization Of A Novel High Plasma Density Pulsed Magnetron Discharge, Linkoping Studies In Science And Technology, pp. 1–2.

MaCak, et al., Ionized Sputter Deposition Using An Extremely High Plasma Density Pulsed Magnetron Discharge, J. Vac. Sci. Technol. A., Jul./Aug. 2000, pp. 1533–1537, vol. 18, No. 4., American Vacuum Society.

Mozgrin, et al., High–Current Low–Pressure Quasi–Stationary Discharge In A Magnetic Field: Experimental Research, Plasma Physics Reports, 1995, pp. 400–409, vol. 21, No. 5.

Rossnagel, et al., Induced Drift Currents In Circular Planar Magnetrons, J. Vac. Sci. Technol. A., Jan./Feb. 1987, pp. 88–91, vol. 5, No. 1, American Vacuum Society.

Sheridan, et al., Electron Velocity Distribution Functions In A Sputtering Magnetron Discharge For The E x B Direction, J. Vac. Sci. Technol. A., Jul./Aug. 1998, pp. 2173–2176, vol. 16, No. 4, American Vacuum Society.

Steinbruchel, A Simple Formula For Low–Energy Sputtering Yields, Appl. Phys. A., 1985, pp. 37–42, vol. 36, Sprigner Verlag.

Encyclopedia Of Low Temperature Plasma, p. 119, vol. 3.

Encyclopedia Of Low Temperature Plasma, p. 123, vol. 3.

Lymberopoulos, et al., Fluid Simulations Of Glow Discharges: Effect Of Metastable Atoms In Argon, J. Appl. Phys., Apr. 1993, pp. 3668–3679, vol. 73, No. 8, American Institute of Physics.

Burnham, et al., Efficient Electric Discharge Lasers In XeF and KrF, Applied Physics Letters, Jul. 1976, pp. 30–32, vol. 29, No. 1, American Institute of Physics.

Fabrikant, et al., Electron Impact Formation Of Metastable Atoms, pp. 3,31,34–37, Amsterdam.

Fahey, et al., High Flux Beam Source Of Thermal Rare–Gas Metastable Atoms, 1980, J. Phys. E. Sci. Instrum., vol. 13, The Institute of Physics.

Verheijen, et al., A Discharge Excited Supersonic Source Of Metastable Rare Gas Atoms, J.Phys. E. Sci. Instrum, 1984, vol. 17.

Eletskii, Excimer Lasers, Sov. Phys. Usp., Jun. 1978, pp. 502–521, vol. 21, No. 6.

Chistyakov, Roman, High Power Pulsed Magnetron Sputtering, U.S. Appl. No: 10/065,277, filed Sep. 30, 2002.

Chistyakov, Roman, Method And Apparatus For Generating High–Density Plasma, U.S. Appl. No. 10/065,629, filed Nov. 4, 2002.

Chistyakov, Roman, High Deposition Rate Sputtering, U.S. Appl. No. 10/065,739, filed Nov. 14, 2002.

Chistyakov, Roman, High–Power Pulsed Magnetically Enhanced Plasma Processing, U.S. Appl. No. 10/065,551, filed Oct. 29, 2002.

Chistyakov, Roman, High–Density Plasma Source, U.S. Appl. No. 10/249,595, filed Apr. 22, 2003.

Chistyakov, Roman, Plasma Generation Using Multi–Step Ionization, U.S. Appl. No. 10/249,202, filed Mar. 21, 2003.

* cited by examiner

US 6,903,511 B2

GENERATION OF UNIFORMLY-DISTRIBUTED PLASMA

BACKGROUND OF INVENTION

Plasma is considered the fourth state of matter. A plasma is a collection of charged particles moving in random directions that is, on average, electrically neutral. One method of generating a plasma is to pass a current through a low-pressure gas that is flowing between two parallel conducting electrodes. Once certain parameters are met, the gas "breaks down" to form the plasma. For example, a plasma can be generated by applying a potential of several kilovolts between two parallel conducting electrodes in an inert gas atmosphere (e.g., argon) at a pressure that is in the range of about $10^{-1}$ to $10^{-2}$ Torr.

Plasma processes are widely used in many industries, such as the semiconductor manufacturing industry. For example, plasma etching is commonly used to etch substrate material and films deposited on substrates in the electronics industry. There are four basic types of plasma etching processes that are used to remove material from surfaces: sputter etching, pure chemical etching, ion energy driven etching, and ion inhibitor etching.

Plasma sputtering is a technique that is widely used for depositing films on substrates. Sputtering is the physical ejection of atoms from a target surface and is sometimes referred to as physical vapor deposition (PVD). Ions, such as argon ions, are generated and then are drawn out of the plasma, and are accelerated across a cathode dark space. The target surface has a lower potential than the region in which the plasma is formed. Therefore, the target surface attracts positive ions.

Positive ions move towards the target with a high velocity and then impact the target and cause atoms to physically dislodge or sputter from the target surface. The sputtered atoms then propagate to a substrate or other work piece where they deposit a film of sputtered target material. The plasma is replenished by electron-ion pairs formed by the collision of neutral molecules with secondary electrons generated at the target surface.

Reactive sputtering systems inject a reactive gas or mixture of reactive gases into the sputtering system. The reactive gases react with the target material either at the target surface or in the gas phase, resulting in the deposition of new compounds. The pressure of the reactive gas can be varied to control the stoichiometry of the film. Reactive sputtering is useful for forming some types of molecular thin films.

Magnetron sputtering systems use magnetic fields that are shaped to trap and concentrate secondary electrons proximate to the target surface. The magnetic fields increase the density of electrons and, therefore, increase the plasma density in a region that is proximate to the target surface. The increased plasma density increases the sputter deposition rate.

BRIEF DESCRIPTION OF DRAWINGS

This invention is described with particularity in the detailed description. The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

Figure 1:
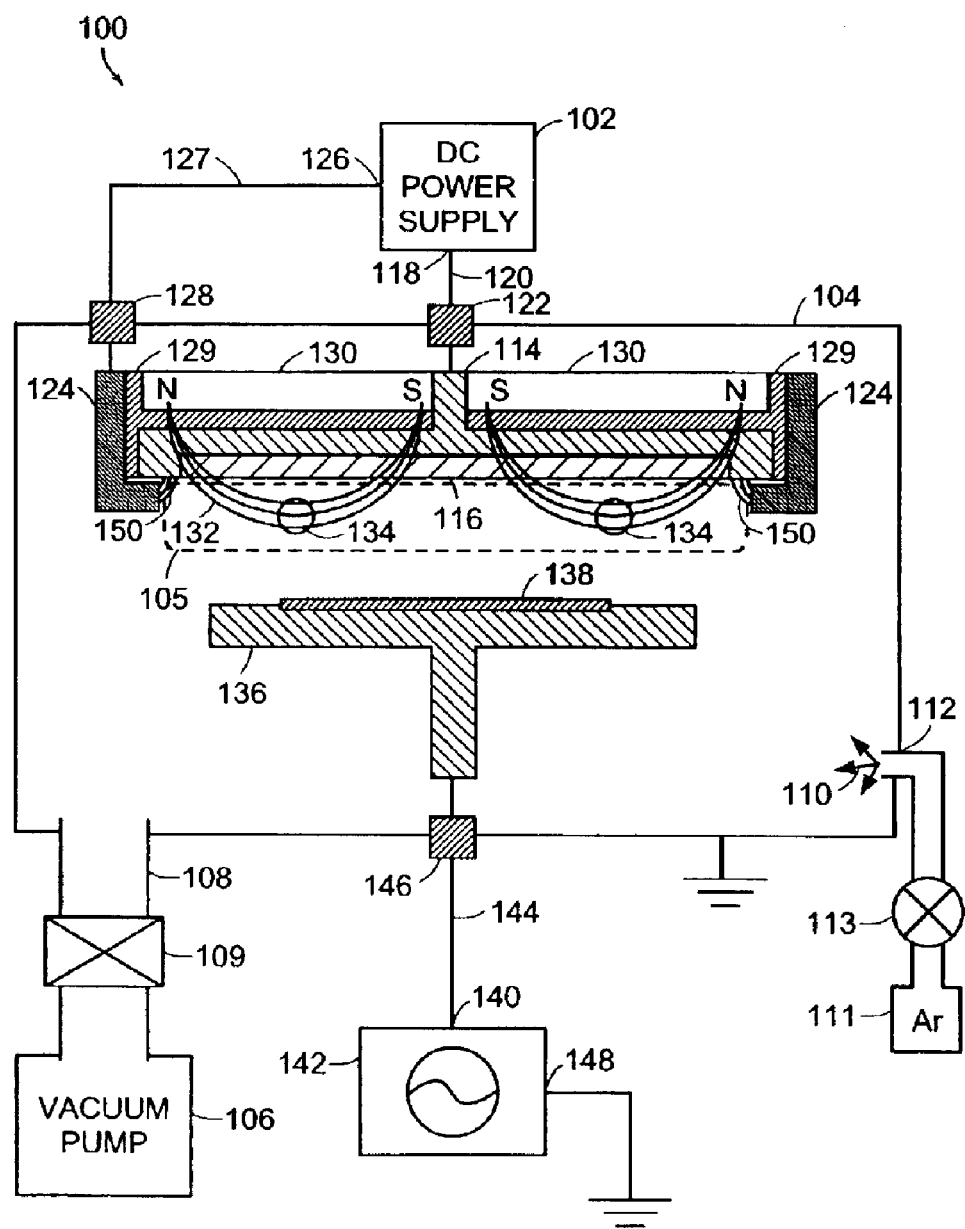
FIG. 1 illustrates a cross-sectional view of a known plasma sputtering apparatus having a direct current (DC) power supply.

FIG. 1 illustrates a cross-sectional view of a known plasma generating apparatus 100 having a DC power supply 102. The known plasma generating apparatus 100 includes a vacuum chamber 104 where a plasma 105 is generated. The vacuum chamber 104 can be coupled to ground. The vacuum chamber 104 is positioned in fluid communication with a vacuum pump 106 via a conduit 108 and a valve 109. The vacuum pump 106 is adapted to evacuate the vacuum chamber 104 to high vacuum. The pressure inside the vacuum chamber 104 is generally less than $10^{-1}$ Torr. A feed gas 110 from a feed gas source 111, such as an argon gas source, is introduced into the vacuum chamber 104 through a gas inlet 112. The gas flow is controlled by a valve 113.

The plasma generating apparatus 100 also includes a cathode assembly 114. The cathode assembly 114 is generally in the shape of a circular disk. The cathode assembly 114 can include a target 116. The cathode assembly 114 is electrically connected to a first terminal 118 of the DC power supply 102 with an electrical transmission line 120. An insulator 122 isolates the electrical transmission line 120 from a wall of the vacuum chamber 104. An anode 124 is electrically connected to a second terminal 126 of the DC power supply 102 with an electrical transmission line 127. An insulator 128 isolates the electrical transmission line 127 from the wall of the vacuum chamber 104. The anode 124 is positioned in the vacuum chamber 104 proximate to the cathode assembly 114. An insulator 129 isolates the anode 124 from the cathode assembly 114. The anode 124 and the second output 126 of the DC power supply 102 are coupled to ground in some systems.

The plasma generating apparatus 100 illustrates a magnetron sputtering system that includes a magnet 130 that generates a magnetic field 132 proximate to the target 116. The magnetic field 132 is strongest at the poles of the magnet 130 and weakest in the region 134. The magnetic field 132 is shaped to trap and concentrate secondary electrons proximate to the target surface. The magnetic field increases the density of electrons and, therefore, increases the plasma density in a region that is proximate to the target surface.

The plasma generating apparatus 100 also includes a substrate support 136 that holds a substrate 138 or other work piece. The substrate support 136 can be electrically connected to a first terminal 140 of a RF power supply 142 with an electrical transmission line 144. An insulator 146 isolates the RF power supply 142 from a wall of the vacuum chamber 104. A second terminal 148 of the RF power supply 142 is coupled to ground.

In operation, the feed gas 110 from the feed gas source 111 is injected into the chamber 104. The DC power supply 102 applies a DC voltage between the cathode assembly 114 and the anode 124 that causes an electric field 150 to develop between the cathode assembly 114 and the anode 124. The amplitude of the DC voltage is chosen so that it is sufficient to cause the resulting electric field 150 to ionize the feed gas 110 in the vacuum chamber 104 and to ignite the plasma 105.

The ionization process in a known plasma sputtering apparatus is generally referred to as direct ionization or atomic ionization by electron impact and can be described by the following equation:

$$Ar + e^- \rightarrow Ar^1 + 2e^-$$

where Ar represents a neutral argon atom in the feed gas 110 and e⁻ represents an ionizing electron generated in response to the voltage applied between the cathode assembly 114 and the anode 124. The collision between the neutral argon atom and the ionizing electron results in an argon ion (Ar⁺) and two electrons.

The plasma 105 is maintained, at least in part, by secondary electron emission from the cathode assembly 114. The magnetic field 132 that is generated proximate to the cathode assembly 114 confines the secondary electrons in the region 134 and, therefore, confines the plasma 105 approximately in the region 134. The confinement of the plasma 105 in the region 134 increases the plasma density in the region 134 for a given input power.

The cathode assembly 114 is negatively biased so that ions in the plasma 105 bombard the target 116. The impact caused by these ions bombarding the target 116 dislodges or sputters material from the target 116. A portion of the sputtered material forms a thin film of sputtered target material on the substrate 138.

Known magnetron sputtering systems have relatively poor target utilization. The term "poor target utilization" is defined herein to mean undesirable non-uniform erosion of target material. Poor target utilization is caused by a relatively high concentration of positively charged ions in the region 134 that results in a non-uniform plasma. Similarly, magnetron etching systems (not shown) typically have relatively non-uniform etching characteristics.

Increasing the power applied to the plasma can increase the uniformity and density of the plasma. However, increasing the amount of power necessary to achieve even an incremental increase in uniformity and plasma density can significantly increase the probability of establishing an electrical breakdown condition leading to an undesirable electrical discharge (an electrical arc) in the chamber 104.

Applying pulsed direct current (DC) to the plasma can be advantageous since the average discharge power can remain relatively low while relatively large power pulses are periodically applied. Additionally, the duration of these large voltage pulses can be preset so as to reduce the probability of establishing an electrical breakdown condition leading to an undesirable electrical discharge. An undesirable electrical discharge will corrupt the plasma process and can cause contamination in the vacuum chamber 104. However, very large power pulses can still result in undesirable electrical discharges regardless of their duration.

In one embodiment, an apparatus according to the present invention generates a plasma having a higher density of ions for a giving input power than a plasma generated by known plasma systems, such as the plasma generating apparatus 100 of FIG. 1. A plasma generating apparatus according to the present invention generates a uniform plasma proximate to a cathode assembly.

Figure 2:
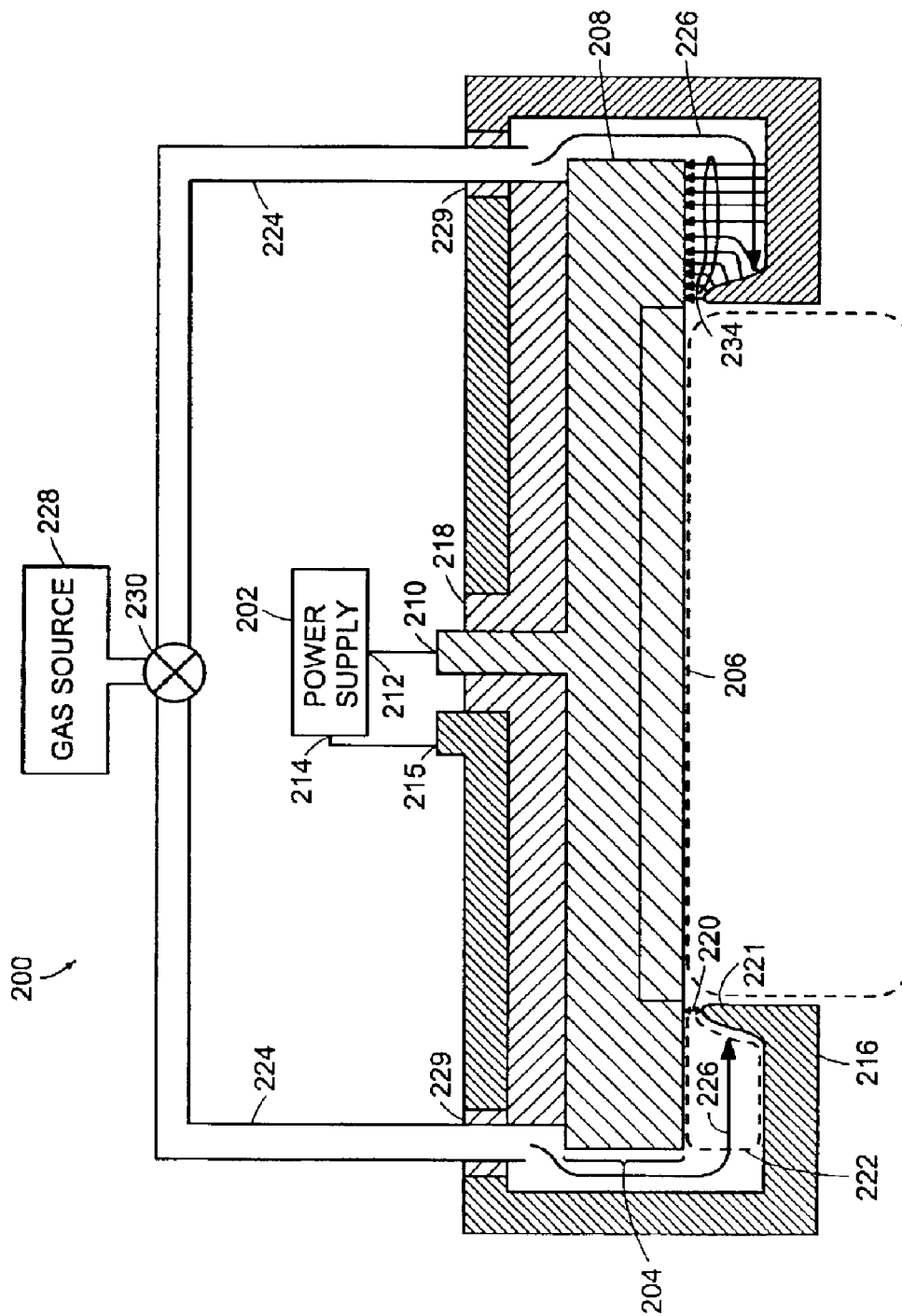
FIG. 2 illustrates a cross-sectional view of a plasma generating apparatus according to one embodiment of the invention.

FIG. 2 is a cross-sectional view of a plasma generating apparatus 200 according to one embodiment of the invention. In the embodiment shown, the plasma generating apparatus 200 is configured for physical vapor deposition (PVD). In other embodiments (not shown), the plasma generating apparatus 200 is configured for etching a substrate (not shown). The plasma generating apparatus 200 can also be configured for chemical vapor deposition (CVD).

The plasma generating apparatus 200 includes a chamber (not shown), such as a vacuum chamber that confines the plasma. The chamber can be coupled to a vacuum system (not shown). The plasma generating apparatus 200 includes a power supply 202. The plasma generating apparatus 200 also includes a cathode assembly 204 that comprises a cathode 208 and a target 206. Some embodiments of the plasma generating apparatus 200 of the present invention that are used for etching do not include a target. In one embodiment, the cathode 208 is formed of a metal material such as stainless steel or any other chemically inert material that does not react with reactive gases.

A first output 212 of the power supply 202 is coupled to an input terminal 210 of the cathode assembly 204. A second output 214 of the power supply 202 is coupled to an input terminal 215 of an anode 216. An insulator 218 isolates the anode 216 from the cathode assembly 204. In one embodiment (not shown), the second output 214 of the power supply 202 and the anode 216 are coupled to ground.

The power supply 202 can be any type of power supply suitable for generating and maintaining a plasma, such as a direct current (DC) power supply, an alternating current (AC) power supply, a radio-frequency (RF) power supply, or a pulsed DC power supply. AC power supplies can require less power to generate and maintain a plasma than DC power supplies. In other embodiments (not shown), the plasma is generated and maintained through the use of a planar discharge, an electron cyclotron resonance (ECR), a capacitively coupled plasma discharge (CCP), a helicon plasma source or an inductively coupled plasma (ICP) discharge. In yet other embodiments (not shown), the plasma is generated and maintained by techniques, such as UV radiation techniques, X-ray techniques, microwave techniques, electron beam techniques, ion beam techniques, or ionizing filament techniques, for example.

In one embodiment, the power supply 202 is a pulsed power supply. In one embodiment, the first output 212 of the power supply 202 couples a negative voltage pulse to the input terminal 210 of the cathode assembly 204. In another embodiment, the second output 214 of the power supply 202 couples a positive voltage pulse to the input terminal 215 of the anode 216.

The anode 216 is positioned so as to form a gap 220 between the anode 216 and the cathode assembly 204 that is sufficient to allow current to flow through a region 222 between the anode 216 and the cathode assembly 204. In one embodiment, the width of the gap 220 is in the range of about 0.3 cm to 10 cm. The width of the gap 220 as well as the surface area of the anode 216 determines the volume of the region 222. The gap 220 and the total volume of the region 222 are parameters in the ionization process as described herein. The dimensions of the gap 220 can be varied throughout the region 222 between the anode 216 and the cathode assembly 204.

In the embodiment shown in FIG. 2, the anode 216 includes a protuberance 221 that reduces a portion of the gap 220 between the anode 216 and the cathode assembly 204. The dimensions of the protuberance 221 can be varied to control a pressure in the region 222. Controlling in the region 222 can increase the efficiency of generating a plasma according to the invention.

In some embodiments (not shown), the anode 216 and/or the cathode 208 can include multiple protuberances, raised areas, depressed areas, surface anomalies, or shapes that control the ionization process. For example, the pressure in the region 222 can be optimized by including a raised area or protuberance (not shown) on the surface of the cathode 208. The raised area can create a narrow passage at a location in the region 222 between the anode 216 and the cathode 208.

One or more gas lines 224 provide feed gas 226 (indicated by arrow) from a feed gas source 228 to the chamber (not shown). The feed gas 226 can be supplied to the gap 220 between the cathode assembly 204 and the anode 216. In one embodiment, the gas lines 224 are isolated from the chamber and other components by insulators 229. In other embodiments, the gas lines 224 are isolated from the feed gas source 228 by using in-line insulating couplers (not shown). The feed gas source 228 can contain any type of feed gas 226 suitable for plasma generation and processing, such as argon. In some embodiments, the feed gas 226 includes a mixture of different gases, such as a mixture of reactive gases, pure reactive gases or non-reactive gases. In one embodiment, the feed gas 226 includes a noble gas or a mixture of noble gases. A gas flow controller 230 controls the flow rate of the feed gas 226. The gas flow controller 230 can be any type of flow controller, such as a simple gas valve or a mass flow controller that precisely meters the feed gas entering into the chamber.

Figure 6:
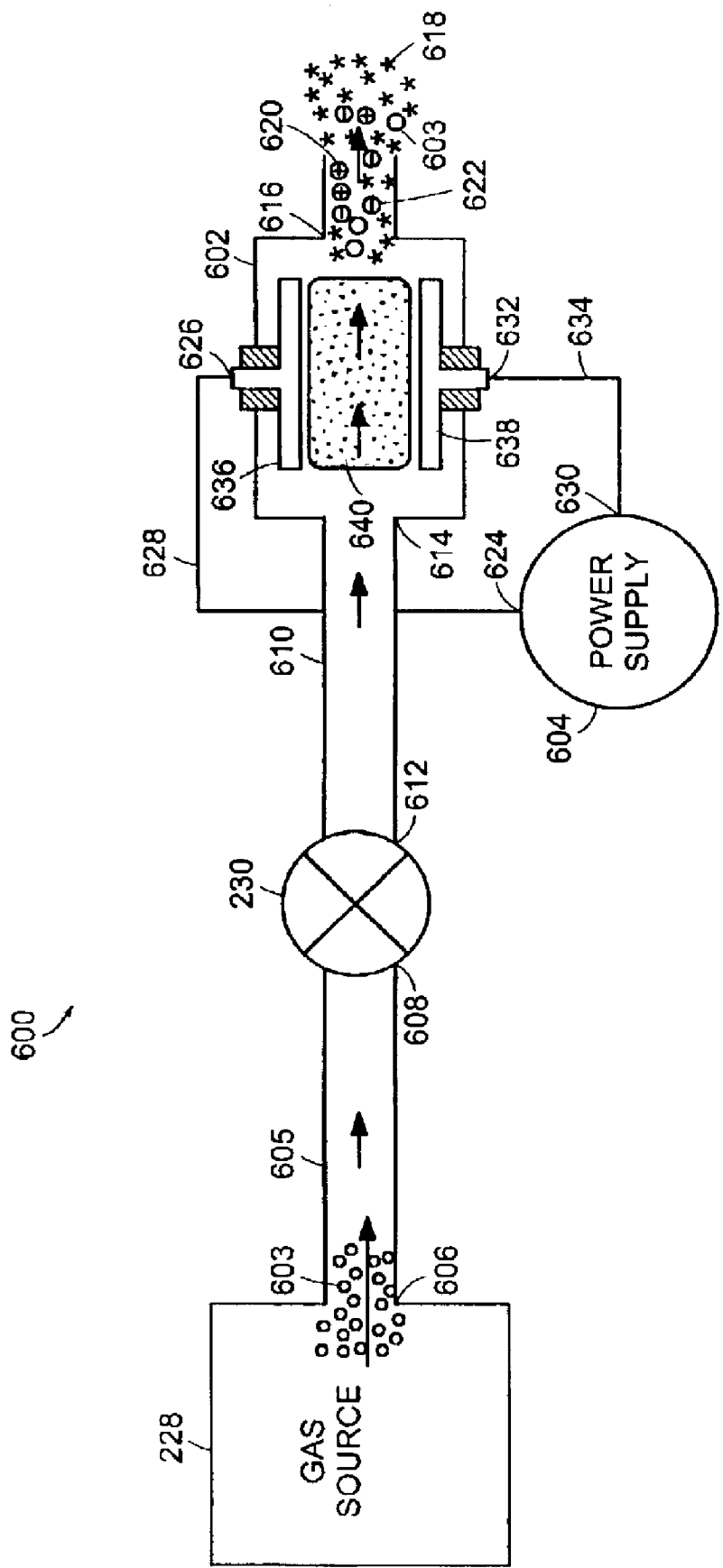
FIG. 6 illustrates a cross-sectional view of an excited atom generator that includes an excited atom source according to the invention.

In one embodiment (not shown), an excited atom source, such as the excited atom source described in connection with FIG. 6, is disposed between the gas source 228 and the chamber. In this embodiment, the gas source 228 supplies a volume of ground state gas atoms to the excited atom source. The excited atom source generates excited atoms including metastable atoms from the ground state atoms and provides the excited atoms including the metastable atoms to the chamber. The excited atom source can provide the excited atoms directly between cathode assembly 204 and the anode 216.

In operation, the feed gas 226 from the feed gas source 228 flows through the gas flow controller 230 into the chamber. In the embodiment that includes the excited atom source, the feed gas 226 flows to the excited atom source. The excited atom source generates excited atoms including metastable atoms from ground state feed gas atoms and provides the excited atoms including the metastable atoms to the chamber.

The flow rate of the feed gas 226 is controlled so as to create the desired chamber pressure. The desired chamber pressure depends on other operating parameters, such as the geometry of the plasma generating apparatus 200 and the desired plasma properties. For example, in one embodiment, the pressure in the chamber can be in the range of about 1 mTorr to 10 Torr.

In one embodiment, the feed gas 226 or the excited atoms are directly supplied to the gap 220 between the cathode assembly 204 and the anode 216. Directly supplying the feed gas 226 or the excited atoms to the gap 220 between the cathode assembly 204 and the anode 216 creates a pressure differential between the region 222 and a region 232 that is located outside of the gap 220. This pressure differential is generated, at least in part, by the difference in the volume in the region 222 and the volume in the region 232.

Adjusting dimensions of the protuberance 221 changes the pressure in the region 222. Since the volume in the region 222 is generally less than the volume in the region 232, the pressure in the region 222 is higher than the pressure in the region 232. This pressure differential causes a rapid volume exchange of feed gas 226 in the region 222 between the cathode assembly 204 and the anode 216. The pressure differential can also improve the efficiency of the ionization of a plasma in the region 222. In addition, the pressure differential can increase the velocity of the ions in the plasma flowing through the gap 220.

Once a suitable volume of feed gas 226 is present in the region 222, the power supply 202 applies a voltage between the cathode 208 and the anode 216. In some embodiments, the power supply 202 applies a voltage potential between the cathode 208 and the anode 216 before the feed gas 226 is injected. In other embodiments, the power supply 202 applies a voltage pulse between the cathode 208 and the anode 216 after the feed gas 226 is injected.

The desired amplitude of the voltage pulses depends on many factors, such as the desired volume and characteristics of the plasma. For example, in one embodiment, the amplitude of the voltage pulses generated by the power supply 202 is in the range of about 50V to 30 kV and the peak current level is in the range of about 1 A to 5 kA. In this embodiment, the width of the voltage pulses is in the range of about 0.1 microsecond to one hundred seconds and the repetition rate of the pulses is below 1 kHz. The resulting peak plasma density of the plasma depends on many factors, such as the geometry of the plasma generating system. For example, in one embodiment, the peak plasma density is in the range of about $10^7$ to $10^{16}$ cm$^{-3}$ for argon feed gas.

The power supply 202 generates a voltage and a current that is large enough to ignite the plasma in the region 222. For example, the power supply 202 can generate an initial voltage that is sufficient to create a plasma discharge voltage that is in the range of about 100V to 1 kV with a discharge current between the cathode 208 and the anode 216 that is in the range of about 0.1 A to 100 A. The desired value of the discharge current is a function of the volume of the plasma and the desired plasma properties. The presence of a magnetic field (not shown) in the region 222 can have a dramatic effect on the required values for the voltage and current that are necessary to generate a plasma with the desired characteristics.

In one embodiment, excited atoms including metastable atoms from the excited atom source are injected in the region 222 between the cathode assembly 204 and the anode 216. Since metastable atoms require less energy to ionize than a similar volume of ground state atoms, the metastable atoms ionize at a higher rate than ground state atoms for the same input energy. In one embodiment, the excited atom source excites ground state atoms to generate excited atoms including metastable atoms and the power supply 202 generates a voltage that is sufficient to ionize the excited atoms including the metastable atoms to generate a plasma. This multi-step plasma is discussed in more detail herein.

The combination of forming the plasma in the gap 220 while injecting additional feed gas and/or excited atoms into the region 222 substantially reduces the probability of establishing a breakdown condition in the chamber when a large power is applied between the cathode 208 and the anode 216. The additional feed gas 226 and/or the excited atoms commingle with the plasma to allow a greater amount of power to be absorbed by the plasma before the plasma contracts and a breakdown condition occurs.

In one embodiment, the plasma tends to diffuse homogenously in the region 232 thereby creating a relatively homogeneous plasma volume. The pressure gradient responsible for this homogenous diffusion is described in more detail herein. Homogeneous plasma volumes are advantageous for many plasma processes. For example, plasma etching processes using homogenous plasma volumes accelerate ions in the high-density plasma towards a surface of a substrate (not shown) being etched in a more uniform manner than conventional plasma etching. Consequently, the surface of the substrate is etched more uniformly. Plasma processes using homogeneous plasma volumes can achieve high uniformity without the necessity of rotating the substrate.

Also, magnetron sputtering systems using homogenous plasma volumes accelerate ions in the high-density plasma towards a surface of the sputtering target 206 in a more uniform manner than conventional magnetron sputtering. Consequently, the target material is deposited more uniformly on a substrate (not shown) without the necessity of rotating the substrate and/or the magnetron. Also, the surface of the sputtering target 206 is eroded more evenly and, thus higher target utilization is achieved. In one embodiment, the anode 216 includes target material in order to reduce possible contamination from sputtering undesired material.

The plasma generating apparatus 200 can be operated in a pulsed power mode. In this mode, relatively high power pulses can be applied to the plasma, while keeping the average applied power relatively low. In this mode, the power supply 202 is a pulsed power supply that generates high-power pulses in the range of about 1 kW to 10 MW. For example, in one embodiment, the power supply 202 generates high-power pulses that form a plasma having a discharge current that is in the range of about 1 A to 5 kA and a discharge voltage that is in the range of about 50V to 500V for a pressure that is in the range of about 1 mTorr to 10 Torr.

Each of the high-power pulses is maintained for a predetermined time that, in some embodiments, is in the range of about one microsecond to ten seconds. In one embodiment, the repetition frequency or repetition rate of the high-power pulses is in the range of about 0.1 Hz to 1 kHz. The average power generated by the second power supply 222 can be less than one megawatt depending on the desired volume and characteristics of the plasma. The thermal energy in the cathode 208 and/or the anode 216 can be conducted away or dissipated by liquid or gas cooling such as helium cooling (not shown).

In one embodiment, the voltage pulse has a relatively rapid rise time that is between about 0.1 microsecond and ten seconds. In one embodiment, the electric field 234 generated by the high-power electrical pulses is a pulsed electric field. In another embodiment, the electric field 234 is a quasi-static electric field. The term "quasi-static electric field" is defined herein to mean an electric field that has a characteristic time of electric field variation that is much greater than the collision time for electrons with neutral gas particles. Such a time of electric field variation can be on the order of ten seconds. The strength and the position of the electric field 234 will be discussed in more detail herein.

The amplitude and pulse width of the high-power electrical pulses are limited by the power that the plasma can absorb before the high-power discharge contracts and terminates. In one embodiment, the amplitude and pulse width of the high-power electrical pulse are increased and thus the density of the plasma is increased by increasing the flow rate of the feed gas 226.

In this mode of operation, the flow rate of the feed gas 226 is related to the amount of power that is applied to the plasma in order to control the plasma density. The density of plasma can be increased by a rapid volume exchange of an additional volume of feed gas 226 with the volume of plasma that is generated in the region 222. In this embodiment, a first volume of feed gas 226 is supplied to the region 222. The first volume of feed gas 226 is then ionized to form a plasma in the region 222. Next, the gas flow controller 230 supplies an additional volume of feed gas 226 to the region 222. The additional volume of feed gas 226 displaces the plasma that is generated in the region 222. Transporting the plasma through the region 222 into the region 232 by a rapid volume exchange of the feed gas 226 increases the power that can be absorbed by the plasma and, thus, generates a higher density plasma in the region 232.

Controlling the flow of the feed gases 226 through the regions 222 can affect the homogeneity, distribution profile, and density of the plasma. Additionally, controlling certain parameters of the high-power pulses generated by the power supply 202, such as power and pulse rate can also affect the homogeneity, distribution profile, and density of the plasma.

In the embodiment that includes the excited atom source (not shown), the density of the plasma is increased by a rapid volume exchange of an additional volume of excited atoms including metastable atoms with the volume of plasma that is generated in the region 222. In this embodiment, a first volume of excited atoms is supplied to the region 222. The first volume of excited atoms is then ionized to form a plasma in the region 222. Next, the excited atom source supplies an additional volume of excited atoms to the region 222. The additional volume of excited atoms displaces the plasma that is generated in the region 222. Transporting the plasma through the region 222 into the region 232 by a rapid volume exchange of the excited atoms increases the power that can be applied to the plasma and, thus, generates a higher density plasma in the region 232.

The plasma generating system 200 can be configured for plasma etching or sputtering. The plasma generating system 200 can be configured for sputtering magnetic materials. Known magnetron sputtering systems generally are not suitable for sputtering magnetic materials because the magnetic field generated by the magnetron can be absorbed by the magnetic target material. RF diode sputtering is sometimes used to sputter magnetic materials. However, RF diode sputtering generally has poor film thickness uniformity and produces relatively low deposition rates.

The plasma generating system 200 can be adapted to sputter magnetic materials by including a target assembly (not shown) having a magnetic target material and by driving that target assembly with a RF power supply (not shown). For example, the plasma generating system 200 can include a RF power supply that provides RF power that is on order of about 10 kW. A substantially uniform initial plasma can be generated by applying RF power across a feed gas that is located proximate to the target assembly. The high-density plasma is generated by applying a strong electric field across the initial plasma as described herein. The RF power supply applies a negative voltage bias to the target assembly. Ions in the high-density plasma bombard the target material thereby causing sputtering.

The plasma generating system 200 can also be adapted to sputter dielectric materials. Dielectric materials can be sputtered by driving a target assembly (not shown) including a dielectric target material with a RF power supply (not shown). For example, the plasma generating system 200 can include a RF power supply that provides RF power that is on order of about 10 kW. A substantially uniform initial plasma can be generated by applying RF power across a feed gas that is located proximate to the target assembly.

In one embodiment, the plasma generating apparatus 200 of the present invention generates a relatively high electron temperature plasma and a relatively high-density plasma. One application for the high-density plasma of the present invention is ionized physical vapor deposition (IPVD), which is a technique that converts neutral sputtered atoms into positive ions to enhance a sputtering process.

In one embodiment, the plasma generating system 200 is configured as an ion beam source. The plasma generating system 200 includes an additional electrode (not shown) that is used to accelerate ions in the plasma. In one embodiment, the external electrode is a grid-type electrode. The ion beam source according to the present invention can generate a very high-density ion flux. For example, the ion beam source can generate ozone flux. Ozone is a highly reactive oxidizing agent that can be used for many applications such as cleaning process chambers, deodorizing air, purifying water, and treating toxic wastes.

Figure 3:
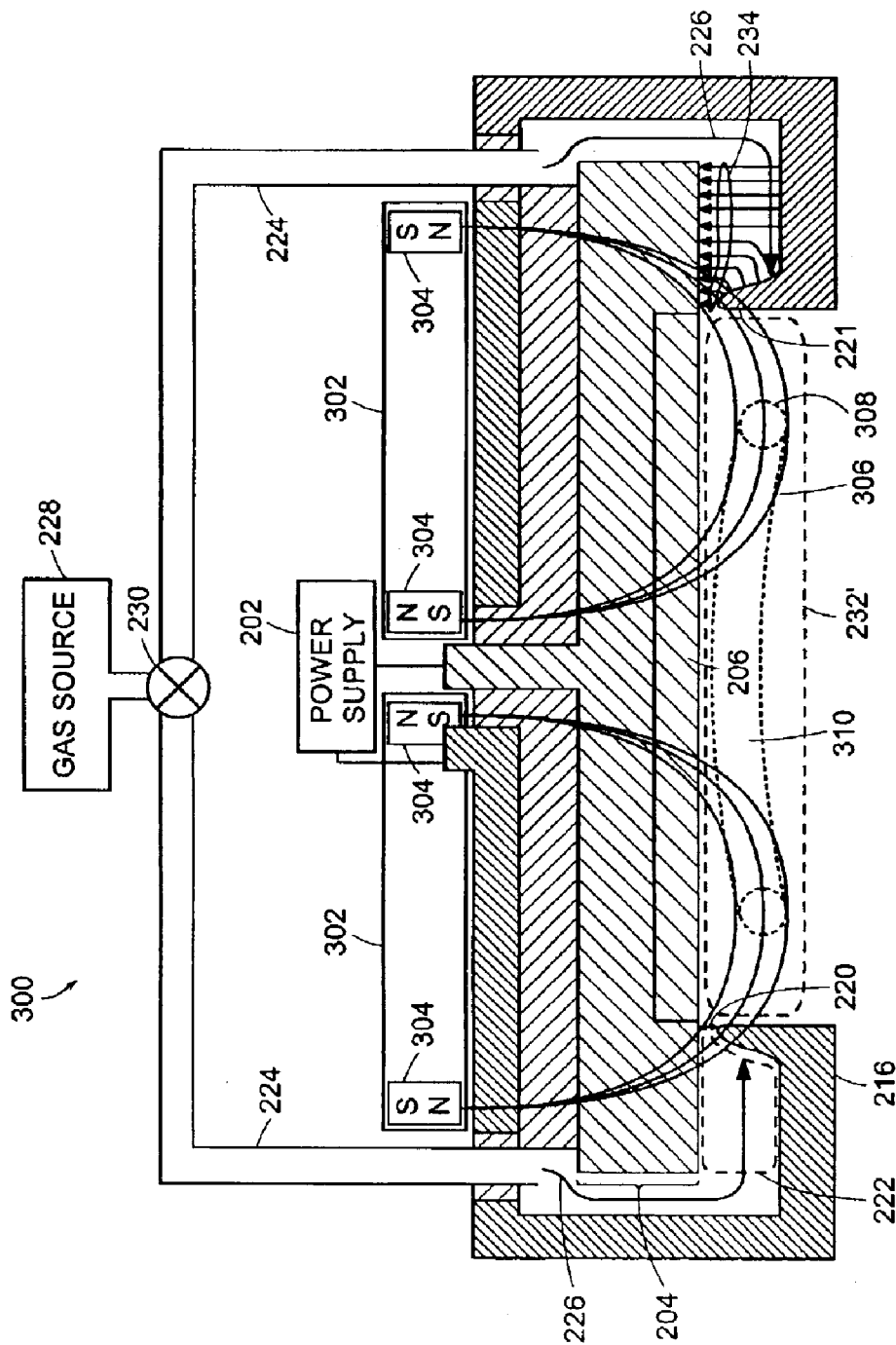
FIG. 3 illustrates a cross-sectional view of a plasma generating apparatus including one embodiment of a magnet assembly according to the invention.

FIG. 3 illustrates a cross-sectional view of a plasma generating apparatus 300 including one embodiment of a magnet assembly 302 according to the invention. The plasma generating apparatus 300 is similar to the plasma generating apparatus 200. However, the plasma generating apparatus 300 includes the magnet assembly 302 having magnets 304. The magnet assembly 302 is positioned to create a magnetic field 306 proximate to the cathode assembly 204. The configuration of the magnet assembly 302 can be varied depending on the desired shape and strength of the magnetic field 306. The magnet assembly 302 can have either a balanced or unbalanced configuration. By "balanced configuration" we mean the magnet assembly 302 creates a symmetrical magnetic field with respect to the magnet assembly 302. By "unbalanced configuration" we mean the magnet assembly 302 creates an asymmetrical magnetic field with respect to the magnet assembly 302. In some embodiments, the magnet assembly 302 rotates to further improve the uniformly of the plasma.

In one embodiment, the magnet assembly 302 includes switching electromagnets (not shown), which generate a pulsed magnetic field proximate to the cathode assembly 204. In some embodiments, additional magnet assemblies (not shown) are placed at various locations around and throughout the process chamber (not shown).

The efficiency of the ionization process can be increased by applying the magnetic field 306 proximate to the cathode assembly 204. The magnetic field 306 tends to trap electrons in the plasma and also tends to trap secondary electrons proximate to the cathode assembly 204. The trapped electrons increase the ionization of the atoms in the feed gas 226 and/or the metastable atoms, thereby increasing the density of the plasma.

In one embodiment, the magnetic field 306 is generated proximate to the target 206 in order to trap electrons in the initial plasma. The plasma is generated by applying an electric field across the feed gas 226 as described herein. A RF power supply applies a negative voltage bias to the cathode assembly 204. Ions in the plasma bombard the target material thereby causing sputtering.

In one embodiment, a magnetic field (not shown) is generated proximate to the plasma in the gap 220. The magnetic field intersects the electric field that is generated across the gap 220. The crossed electric and magnetic fields can increase the efficiency of generating the plasma in the gap 220 by trapping electrons and ions in the plasma.

A magnetron sputtering process using a uniformly distributed plasma according to the invention accelerates ions in the plasma towards the surface of the sputtering target in a more uniform manner than with conventional magnetron sputtering. Consequently, the surface of the sputtering target is eroded more evenly and, thus higher target utilization is achieved. Additionally, the target material from the sputtering target is deposited more uniformly on a substrate (not shown) without the necessity of rotating the substrate and/or the magnetron.

In operation, the magnetic field 306 is generated proximate to the cathode assembly 204. In one embodiment, the permanent magnets 304 continuously generate the magnetic field 306. In some embodiments, electro-magnets (not shown) generate the magnetic field 306 by energizing a current source that is coupled to the electromagnets. After the magnetic field 306 is generated, the feed gas 226 from the gas source 228 is supplied between the cathode assembly 204 and the anode 216. A volume of the feed gas 226 fills in the region 222. In one embodiment (not shown), an excited atom source, such as described in connection with FIG. 6, supplies a volume of excited atoms including metastable atoms to the region 222.

Next, the power supply 202 generates an electric field 234 across the feed gas 226 to ignite the plasma in the region 222. In one embodiment, the feed gas 226 flows through the region 222 and continuously displaces the initially generated plasma. The plasma diffuses into the region 232' and the magnetic field 306 traps electrons in the plasma. A large fraction of the electrons are concentrated in the region 308 that corresponds to the weakest area of the magnetic field 306 that is generated by the magnet assembly 302. By trapping the electrons in the region 308, the magnetic field 306 substantially prevents the plasma from diffusing away from the cathode assembly 204.

The desired strength of the magnetic field 306 depends upon many factors, such as the volume of the plasma and the desired plasma properties. For example, in one embodiment, the strength of the magnetic field 306 is in the range of about fifty to two thousand gauss.

In one embodiment, the power supply 202 generates an electric field 234 across a volume of excited atoms including metastable atoms that are generated by an excited atom source. The electric field 234 generates the plasma in the region 222. In one embodiment, an additional volume of excited atoms including metastable atoms continues to flow through the region 222 and displaces the plasma. The plasma diffuses into the region 232' as described herein. The magnetic field 306 traps electrons in the plasma. A large fraction of the trapped electrons are concentrated in the region 308 that corresponds to the weakest area of the magnetic field 306. By trapping electrons in the plasma, the magnetic field 306 prevents the plasma from diffusing away from the cathode assembly 204.

The magnetic field 306 improves the homogeneity of the high-density plasma. The magnetic field 306 also increases the ion density of the high-density plasma by trapping electrons in the initial plasma and also by trapping secondary electrons proximate to the cathode assembly 204. The trapped electrons ionize ground state atoms and excited atoms in the initial plasma thereby generating the high-density plasma. In one embodiment (not shown), a magnetic field is generated in the region 222 to substantially trap electrons in the area where the plasma is initially ignited.

The magnetic field 306 also promotes increased homogeneity of the plasma by setting up a substantially circular electron ExB drift current 310 proximate to the cathode assembly 204. In one embodiment, the electron ExB drift current 310 generates a magnetic field that interacts with the magnetic field 306 generated by the magnet assembly 302.

When high-power pulses are applied between the cathode assembly 204 and the anode 216, secondary electrons are generated from the cathode assembly 204 that move in a substantially circular motion proximate to the cathode assembly 204 according to crossed electric and magnetic fields. The substantially circular motion of the electrons generates the electron ExB drift current 310. The magnitude of the electron ExB drift current 310 is proportional to the magnitude of the discharge current in the plasma and, in one embodiment, is approximately in the range of about three to ten times the magnitude of the discharge current.

In one embodiment, the substantially circular electron ExB drift current 310 generates a magnetic field that interacts with the magnetic field 306 generated by the magnet assembly 302. In one embodiment, the magnetic field generated by the electron ExB drift current 310 has a direction that is substantially opposite to the magnetic field 306 generated by the magnet assembly 302. The magnitude of the magnetic field generated by the electron ExB drift current 310 increases with increased electron ExB drift current 310. The homogeneous diffusion of the plasma in the region 232' is caused, at least in part, by the interaction of the magnetic field 306 generated by the magnet assembly 302 and the magnetic field generated by the electron ExB drift current 310.

In one embodiment, the electron ExB drift current 310 defines a substantially circular shape for low current density plasma. However, as the current density of the plasma increases, the substantially circular electron ExB drift current 310 tends to have a more complex shape as the interaction of the magnetic field 306 generated by the magnet assembly 302, the electric field generated by the power supply 202, and the magnetic field generated by the electron ExB drift current 310 becomes more acute. For example, in one embodiment, the electron ExB drift current 310 has a substantially cycloidal shape. The exact shape of the electron ExB drift current 310 depends on various factors.

As the magnitude of the electron ExB drift current 310 increases, the magnetic field generated by the electron ExB drift current 310 becomes stronger and eventually overpowers the magnetic field 306 generated by the magnet assembly 302. The magnetic field lines that are generated by the magnet assembly 302 exhibit substantial distortion that is caused by the relatively strong magnetic field that is generated by the relatively large electron ExB drift current 310. Thus, a large electron ExB drift current 310 generates a stronger magnetic field that strongly interacts with and can begin to dominate the magnetic field 306 that is generated by the magnet assembly 302.

The interaction of the magnetic field 306 generated by the magnet assembly 302 and the magnetic field generated by the electron ExB drift current 310 generates magnetic field lines that are somewhat more parallel to the surface of the cathode assembly 204 than the magnetic field lines generated by the magnet assembly 302. The somewhat more parallel magnetic field lines results in a more uniformly distributed plasma in the area 232'.

Figure 4:
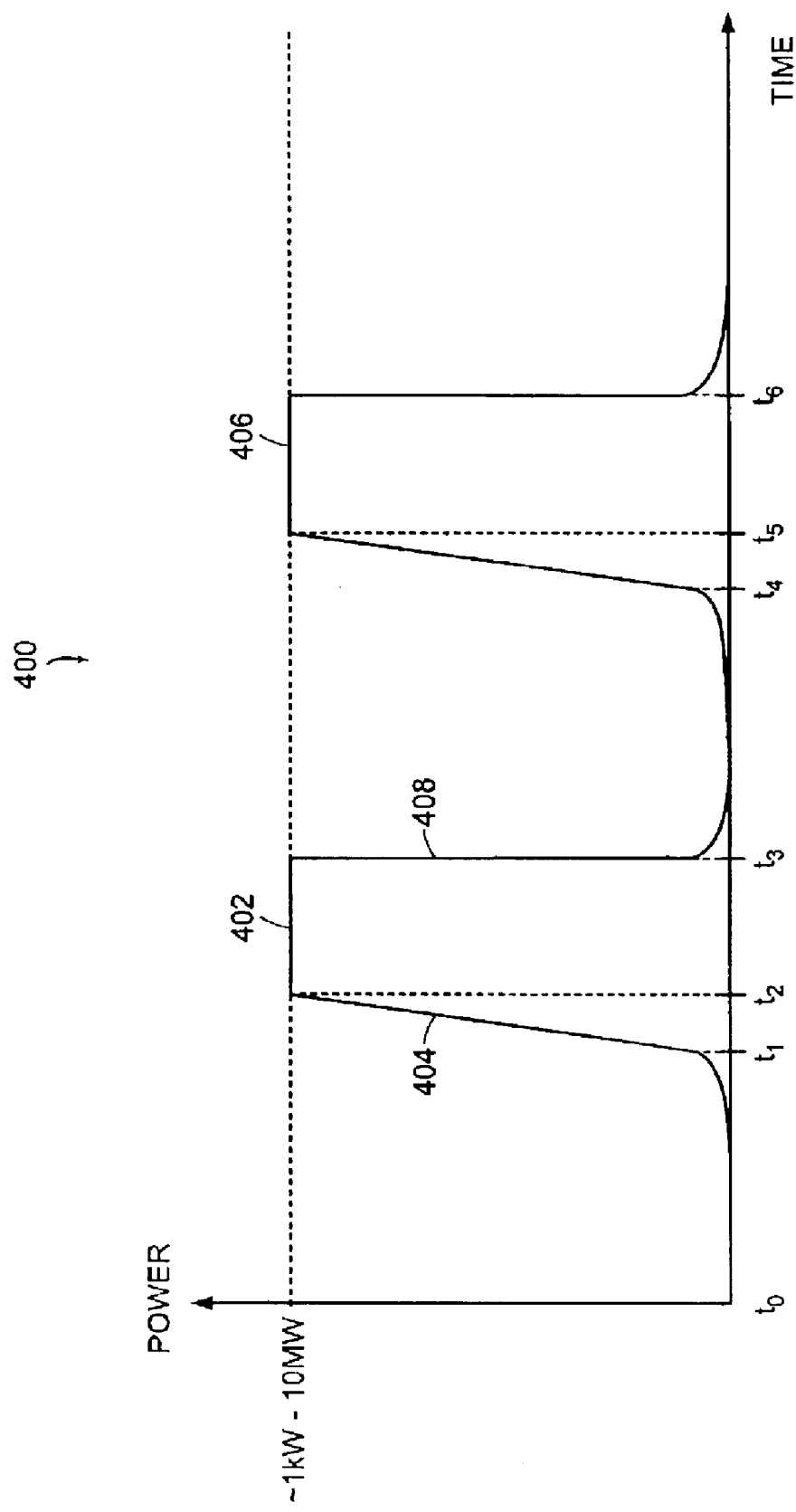
FIG. 4 illustrates a graphical representation of the power as a function of time for periodic pulses applied to a plasma generated by the plasma generating system of FIG. 2.

FIG. 4 illustrates a graphical representation 400 of the power as a function of time for periodic pulses applied to a plasma generated by the plasma generating system 200 of FIG. 2 and the plasma generating system 300 of FIG. 3. In one illustrative embodiment, the feed gas 226 flows into the region 222 between the cathode assembly 208 and the anode 216 at time $t_0$, before the power supply 202 is activated.

The time required for a sufficient quantity of feed gas 226 to flow into the region 222 depends on several factors including the flow rate of the feed gas 226 and the desired operating pressure. At time $t_1$, the power supply 202 generates a power pulse 402 that is in the range of about 0.01 kW to 100 kW and applies the power pulse 402 between the cathode assembly 204 and the anode 216. The power pulse 402 causes atoms in the feed gas 226 to become either excited or ionized, thereby generating the plasma. An additional volume of feed gas 226 flows into the region 222 between time $t_1$ and time $t_2$ substantially displacing the initially generated plasma. The plasma is displaced into the region 232 proximate to the sputtering target 206.

In one embodiment, the pulse width of the power pulse 402 is in the range of about one microsecond to ten seconds. The power pulse 402 is terminated at time $t_3$. In one embodiment (not shown), after the delivery of the power pulse 402, the power supply 202 supplies a continuously applied nominal power to sustain the plasma, while the power supply 202 prepares to deliver another power pulse 406.

At time $t_4$, the power supply 202 delivers another power pulse 406 having a rise time from $t_4$ to $t_5$ and terminating at time $t_6$. In one embodiment, the repetition rate of the power pulses 402, 406 is in the range of about 0.1 Hz to 10 kHz. The particular size, shape, width, and frequency of the power pulses 402, 406 depend on the process parameters, such as the operating pressure, the design of the power supply 202, the presence of a magnetic field proximate to the cathode assembly 204, and the volume and characteristics of the plasma, for example. The shape and duration of the leading edge 404 and the trailing edge 408 of the power pulse 402 are chosen to control the rate of ionization of the plasma.

Figure 5:
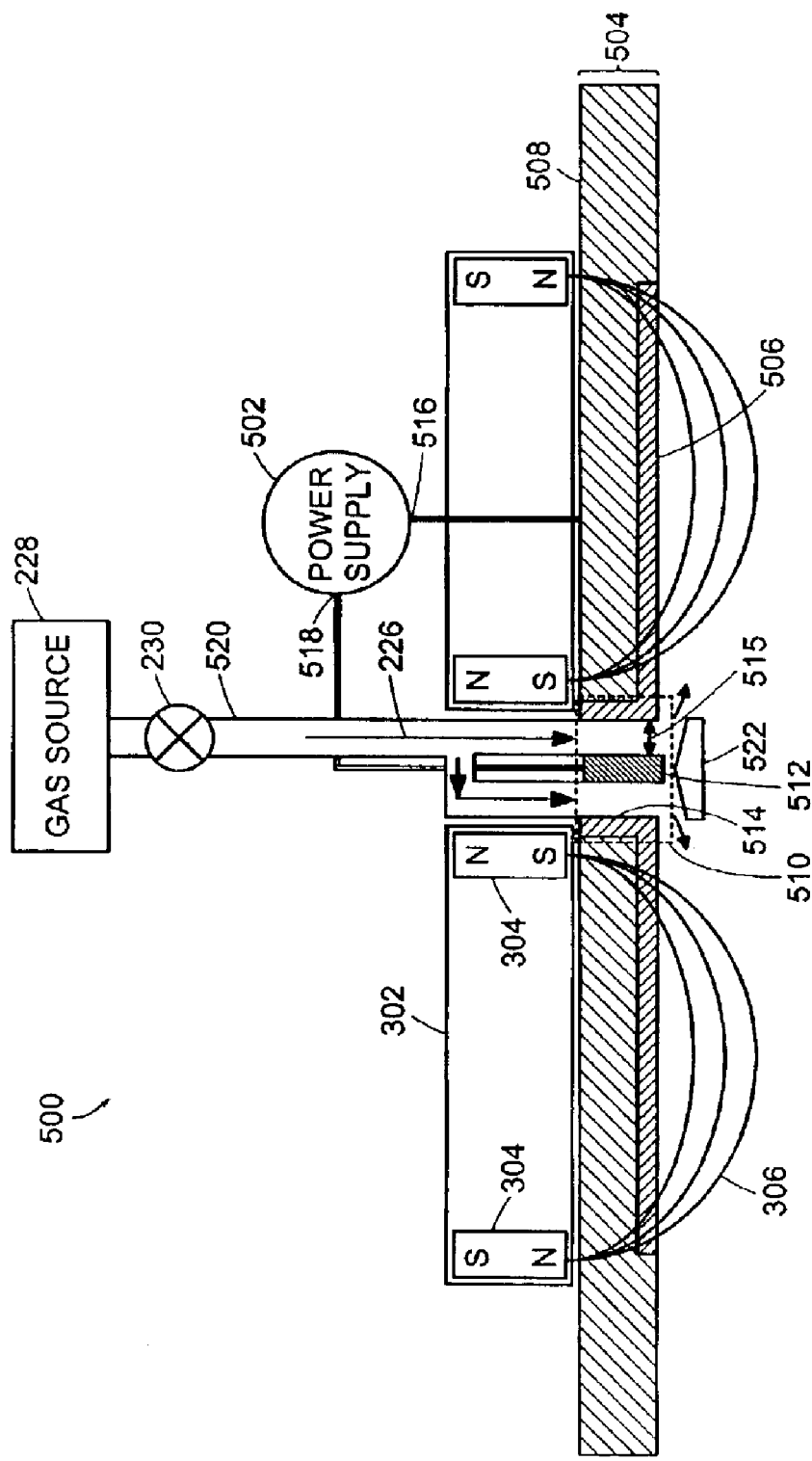
FIG. 5 is a cross-sectional view of another embodiment of a plasma generating apparatus according to the present invention.

FIG. 5 is a cross-sectional view of another embodiment of a plasma generating apparatus 500 according to the present invention. The plasma generating apparatus 500 includes a power supply 502. The power supply 502 can be any type of power supply, such as a pulsed power supply, a radio-frequency (RF) power supply, a direct-current (DC) power supply, or an alternating-current (AC) power supply.

The plasma generating apparatus 500 also includes a cathode assembly 504. In one illustrated embodiment, the plasma generating apparatus 500 is configured for magnetron sputtering. In this embodiment, the cathode assembly 504 includes a target 506 and a cathode 508. In one embodiment, the cathode assembly 504 is substantially disk-shaped and includes a centered aperture.

The cathode assembly 504 can be configured to include a hollow cathode 510 located at the centered aperture of the cathode assembly 504. An anode 512 is positioned in the center of the hollow cathode 510. The hollow cathode 510 includes an inner surface 514 that substantially surrounds the anode 512. In one embodiment, the inner surface 514 is a cylindrical wall. In one embodiment, target material covers the inner surface 514 of the hollow cathode 510. The inner surface 514 forms a gap 515 with the anode 512. In some embodiments (not shown), the anode 512 and/or the inner surface 514 can include multiple protuberances, raised areas, depressed areas, surface anomalies, or shapes that control the ionization process. For example, the pressure in the gap 515 can be optimized by including a raised area or protuberance on the surface of the anode 512 and/or on the inner surface 514.

A first output 516 of the power supply 502 is coupled to the cathode assembly 504. A second output 518 of the power supply 502 is coupled to the anode 512. In one embodiment, the second output 518 of the power supply 502 and the anode 512 are both coupled to ground.

The plasma generating apparatus 500 also includes the gas source 228. The feed gas 226 is supplied to the hollow cathode 510 through a gas line 520. A gas flow controller 230, such as a mass flow controller or gas valve controls the flow of the feed gas 226 to the hollow cathode 510.

In one embodiment (not shown), the plasma generating apparatus 500 includes an excited atom source, such as the excited atom source that is described in connection with FIG. 6. The excited atom source receives ground state atoms from the gas source 228 and excites the ground state atoms to an excited state, thereby generating excited atoms including metastable atoms from the ground state atoms. The excited atom source provides the excited atoms to the hollow cathode 510.

In one embodiment, the plasma generating apparatus 500 also includes a plasma shaping device 522. The shape and size of the plasma shaping device 522 is chosen so as to optimize the shape and distribution of the plasma that is generated by the hollow cathode 510. In the embodiment shown, the plasma shaping device 522 is formed in the shape of a plate. However, the plasma shaping device 522 can be any desired shape according to the present invention. In one embodiment (not shown), the plasma shaping device 522 is coated with target material so as to reduce contamination in the chamber due to unintended sputtering from the plasma shaping device 522.

In one embodiment, the plasma generating apparatus 500 also includes a magnet assembly 302 that generates a magnetic field 306 as described herein. Any type of magnet assembly can be used. The magnetic field 306 can assist in distributing the plasma as described with reference to FIG. 3.

In operation, a volume of feed gas 226 from the gas source 228 and/or a volume of excited atoms from an excited atom source (not shown) are supplied to the hollow cathode 510 through the gas flow controller 230. In one embodiment, the feed gas 226 and/or the excited atoms are supplied through the gap 515 between the anode 512 and the inner surface 514 of the cathode assembly 504. The power supply 502 generates a voltage between the cathode assembly 504 and the anode 512 that is large enough to ignite a plasma in the gap 515.

The gas flow controller 230 supplies an additional volume of feed gas 226 and/or an additional volume of excited atoms to the gap 515 while the hollow cathode 510 generates the plasma. The additional volume of feed gas 226 and/or the additional volume of excited atoms substantially displace the plasma in the hollow cathode 510. This volume exchange forces the plasma towards the plasma shaping apparatus 522. The plasma shaping apparatus 522 deflects the plasma such that it flows proximate to the target 506. The combination of the volume exchange and the plasma deflection creates a uniformly distributed plasma proximate to the target 506. In one embodiment, the magnetic field 306 contributes to an even more uniform plasma as discussed with reference to FIG. 3.

The plasma generating apparatus 500 can result in the formation of a relatively high-density plasma as compared with conventional plasma generators because a relatively high power can be absorbed in the plasma. By injecting additional feed gas 226 and/or excited atoms in the hollow cathode 510 during the plasma generation, higher power and longer duration pulses can be applied to the plasma. The additional feed gas 226 and excited atoms can absorb the additional power that would otherwise cause the plasma to contract and terminate.

FIG. 6 illustrates a cross-sectional view of an excited atom generator 600 that includes an excited atom source 602 according to the invention. Such an excited atom generator 600 is described in co-pending U.S. patent application Ser. No. 10/249,202 entitled "Plasma Generation Using Multi-Step Ionization," filed on Mar. 21, 2003, which is assigned to the present assignee. The entire disclosure of U.S. patent application Ser. No. 10/249,202 is incorporated herein by reference.

The excited atom generator 600 includes the gas source 228 and the gas flow controller 230. There are many possible configurations for the excited atom generator 600. In one embodiment, a gas source 228 supplies ground state atoms 603 of a feed gas to the excited atom source 602.

The excited atom generator 600 also includes a power supply 604. The power supply 604 can be a direct-current (DC), an alternating-current (AC), a radio-frequency (RF), or a pulsed power supply, for example. A first output 624 of the power supply 604 is coupled to a first input 626 of the excited atom source 602 with a first transmission line 628. A second output 630 of the power supply 604 is coupled to a second input 632 of the excited atom source 602 with a second transmission line 634. The first input 626 of the excited atom source 602 is coupled to a first electrode 636 in the excited atom source 602. The second input 632 of the excited atom source 602 is coupled to a second electrode 638 in the excited atom source 602.

An output 606 of the gas source 228 is coupled to one end of a gas line 605. The other end of the gas line 605 is coupled to an input 608 of the gas controller 230. An output 612 of the gas controller 230 is coupled to one end of second gas line 610. The other end of the second gas line 610 is coupled to an input 614 of the excited atom source 602. A volume of excited atoms including metastable atoms exits the excited atom source 602 through the output 616.

In operation, ground state atoms 603 from the gas source 228 flow to the excited atom source 602 though the gas flow controller 230. The gas flow controller 230 controls the flow rate of the ground state atoms 603. The ground state atoms 603 flow between the first electrode 636 and the second electrode 638. The first 636 and the second electrodes 638 are charged by the power supply 604, such that a discharge is created in a discharge region 640 between the first 636 and the second electrodes 638. At least a portion of the ground state atoms 603 that are injected through the discharge region 640 are energized to an excited state, such as a metastable state.

In one embodiment, a large portion of the exited atoms 618 are metastable atoms. The term "metastable atoms" is defined herein to mean excited atoms having energy levels from which dipole radiation is theoretically forbidden. Metastable atoms have relatively long lifetimes compared with other excited atoms. Metastable atoms are created because, in theory, the selection rules forbid relaxation of these excited atoms to the ground state and the emission of dipole radiation. However, the selection rules were determined using certain approximations. Consequently, in practice, there is a finite probability that the metastable atoms relax to the ground state and emit dipole radiation. The actual lifetime of metastable atoms is on order of milliseconds to minutes.

All noble gas atoms have metastable states. For example, argon has two metastable states, see, for example, Fabrikant, I. I., Shpenik, O. B., Snegursky, A. V., and Zavilopulo, A. N., *Electron Impact Formation of Metastable Atoms*, North-Holland, Amsterdam. Argon metastable atoms can be generated by applying a sufficient voltage across argon feed gas containing ground state argon atoms. When an ionizing electron (e⁻) collides with a ground state argon (Ar) atom, a metastable argon atom and an electron are generated.

Argon atoms require a minimum of 11.56 eV of energy to reach one of its two metastable states. Whereas, 15.76 eV of energy is required to eject the electron and ionize the atom. Therefore, the energy required to excite ground state argon atoms to a metastable state is lower than the 15.76 eV energy that is required to ionize ground state argon atoms. Thus, a large number of argon atoms can be energized to a metastable state using less energy then would be required to directly ionize the argon atoms.

Depending on the geometry and the operating parameters of the excited atom source 602, a relatively small volume of ions 620 and electrons 622, as well as some ground state atoms 603 can be present in the volume of excited atoms 618 including the metastable atoms. For example, the output 616 of the excited atom source 602 can be coupled to one or more of the gas lines 224 of the plasma generating apparatus 200 of FIG. 2 to supply excited atoms 618 to the region 222. The output 616 of the excited atom source 602 can also be coupled to the gas line 520 of the plasma generating apparatus 500 of FIG. 5 to supply excited atoms 618 to the hollow cathode 510. In one embodiment, the volume of ions 620 and the volume of electrons 622 are removed from the volume of excited atoms 618 before the excited atoms 618 are injected into the gas lines 224 (FIG. 2) or the gas line 520 (FIG. 5), as described herein The excited atoms 618 facilitate a multi-step or stepwise ionization process to generate the plasma. The term "multi-step ionization process" is defined herein to mean an ionization process whereby ions are ionized in at least two distinct steps. For example, in a first step, atoms are excited from a ground state to an excited state; and in a second step, the atoms in the excited state are further excited and ionized. The term "multi-step ionization process" also includes ionization processes with three or more steps.

Some of the ground state atoms 603 are energized to an energy that ionizes the atoms, thereby releasing ions 620 and electrons 622 into the stream of exited atoms 618. The excited atoms 218, the free ions 620 and electrons 622 then pass through the output 616 of the excited atom source 602. In addition, ground state atoms 603 can also be present in the stream of excited atoms 618. The ground state atoms 603 can originate from the gas source 228 or can be excited atoms that have decayed back to a ground state.

One advantage of using excited atoms 618 in the plasma process is that they require less energy to ionize than ground state atoms 603. For example, a metastable argon atom 618 requires only about 4 eV of energy to ionize as compared with about 15.76 eV of energy required to ionize an argon ground state atom 603. The difference between exciting a ground state atom 603 to an excited state, such as a metastable state, and ionizing a ground state atom 603 is discussed below.

Argon atoms can be ionized by a two-step ionization process. In the first step, ionizing electrons e⁻ are generated by applying a sufficient voltage between two electrodes. When an ionizing electron e⁻ collides with a ground state argon (Ar) atom, a metastable argon atom and an electron are generated. Metastable atoms can be present in considerable densities in weakly ionized discharges. In the second step, an ionizing electron e⁻ collides with the metastable argon atom and the metastable argon atom is ionized and two electrons are generated, as shown below.

where Ar represents an argon ground state atom, and e⁻ represents an ionizing electron that is generated when sufficient voltage is applied between the first electrode 636 and the second electrode 638, and Ar* represents a metastable argon atom. The second step can occur in the plasma chamber. The collision between the metastable argon atom and the ionizing electron results in an argon ion (Ar⁺) and two electrons.

Plasma generation using multi-step ionization according to the present invention is described in connection with the generation of metastable atoms. However, the present invention is not limited to multi-step ionization using metastable atoms. Plasma generation using multi-step ionization according to the present invention can be achieved by generating metastable molecules.

Controlling the pressure in the excited atom source 602 can increase the volume of exited atoms 618 that are generated by the excited atom source 602. In one embodiment, a pressure at the input 614 of the excited atom source 602 is lower than a pressure at the output 616 of the excited atom source 602. The pressure differential increases the efficiency with which the excited atoms 618 are generated by the excited atom source 602. For example, a diameter of the input 614 can be chosen to be greater than a diameter of the output 616. This difference in diameters can be used to optimize the pressure in the discharge region 640 and therefore increase the efficiency with which the excited atoms 618 are generated.

Once a sufficient volume of excited atoms 618 is present in the region 222 (FIG. 2), the power supply 202 generates the electric field 234 proximate to the volume of excited atoms 618 between the cathode assembly 204 and the anode 216. The electric field 234 raises the energy of the volume of excited atoms 618 causing collisions between neutral atoms, electrons, and excited atoms 618. These collisions generate the plasma in the region 222. The plasma can include ions, metastable atoms and additional excited atoms 618. The efficiency of the multi-step ionization process increases as the density of excited atoms 618 in the region 222 increases. The multi-step ionization process described herein substantially increases the rate at which a plasma is formed and, therefore, generates a relatively dense plasma. The rate is increased because only a relatively small amount of energy is required to ionize the excited atoms 618.

Furthermore, as the density of the excited atoms 618 in the plasma increases, the efficiency of the ionization process rapidly increases. The increased efficiency results in an avalanche-like process that substantially increases the density of the plasma. In addition, the ions in the plasma strike the cathode assembly 204 (FIG. 2) causing the secondary electron emission from the cathode assembly 204. The secondary electrons interact with ground state atoms 603 and with the excited atoms 618 in the plasma. This interaction further increases the density of ions in the plasma as additional volumes of excited atoms 618 enter the region 222. Thus, for the same input energy, the density of the plasma that is generated by the multi-step ionization process according to the present invention is significantly greater than a plasma that is generated by direct ionization of ground state atoms 603.

Figure 7:
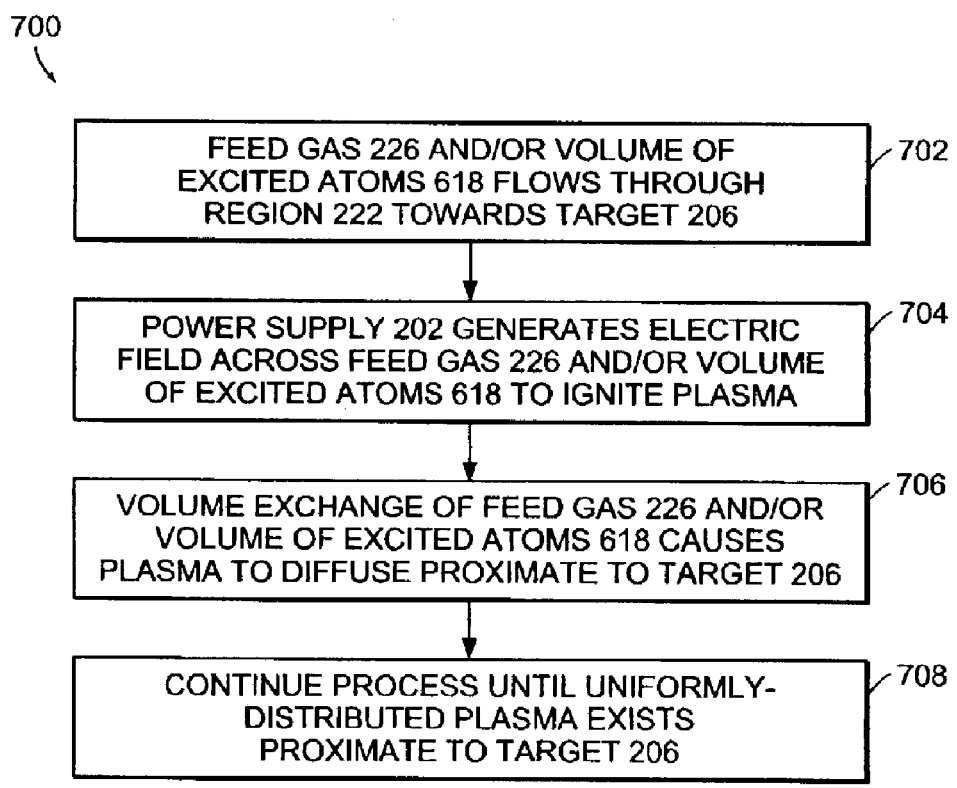
FIG. 7 is a flowchart of an illustrative process of generating a uniformly-distributed plasma according to the present invention.

FIG. 7 is a flowchart 700 of an illustrative process of generating a uniformly-distributed plasma according to the present invention. In some embodiments, a magnetic field 306 (FIG. 3) is generated proximate to the target 206 as described herein. The feed gas 226 (FIG. 2) from the feed gas source 228 flows into the region 222 (step 702). The volume and the flow rate of the feed gas 226 are controlled by the feed gas controller 230. In some embodiments, excited atoms 618 (FIG. 6) from the excited atom source 602 flow into the region 222 (FIG. 2).

After a suitable volume of the feed gas 226 and/or excited atoms 618 is supplied to the region 222, the power supply 202 generates a voltage across the feed gas 226 and/or the excited atoms 618 in the region 222 (step 704). The voltage generates an electric field that is large enough to ignite the feed gas 226 and/or the excited atoms 618 to generate the plasma. Additional feed gas 226 and/or excited atoms 618 flows into the region 222 while the plasma is being generated, thereby forcing the plasma to diffuse into the region 232 proximate to the target 206 (step 706). This process continues until a suitable volume of plasma is located in the region 232 proximate to the target 206 (step 708). The plasma that is located in the region 232 proximate to the target 206 is substantially uniformly-distributed.

Equivalents

While the invention has been particularly shown and described with reference to specific preferred embodiments, it should be understood by those skilled in the art that various changes in form and detail may be made therein without departing from the spirit and scope of the invention as defined herein.

What is claimed is:

1. A plasma generator comprising:
   a. a cathode assembly that is positioned adjacent to an anode and forming a gap there between;
   b. a gas source that supplies a volume of feed gas;
   c. an excited atom source that generates a volume of excited atoms from the volume of feed gas supplied by the gas source, the excited atom source supplying the volume of excited atoms to the gap; and
   d. a power supply that generates an electric field across the gap between the cathode assembly and the anode, the electric field ionizing the volume of gas excited atoms that is supplied to the gap by the excited atom source, thereby creating a plasma in the gap.

2. The plasma generator of claim 1 wherein the cathode assembly comprises a target.

3. The plasma generator of claim 1 further comprising a gas flow controller that controls the volume of feed gas supplied by the gas source.

4. The plasma generator of claim 1 wherein the power supply is chosen from the group comprising a pulsed DC power supply, a RF power supply, an AC power supply, and a DC power supply.

5. The plasma generator of claim 1 wherein the power supply generates a constant power.

6. The plasma generator of claim 1 wherein the power supply generates a constant voltage.

7. The plasma generator of claim 1 wherein a width of the gap is in the range of about 0.3 cm to 10 cm.

8. The plasma generator of claim 1 further comprising a magnet assembly that generates a magnet field that substantially traps electrons in the plasma.

9. The plasma generator of claim 1 wherein a peak plasma density of the plasma is in the range of about $10^7$ cm$^{-3}$ to $10^{16}$ cm$^{-3}$.

10. The plasma generator of claim 1 wherein the cathode assembly comprises a hollow cathode comprising an inner surface that substantially surrounds the anode.

11. The plasma generator of claim 10 wherein the inner surface comprises a cylindrical wall.

12. The plasma generator of claim 1 wherein the plasma created in the gap diffuses proximate to a surface of the cathode assembly.

13. The plasma generator of claim 12 wherein the plasma is substantially uniformly-distributed proximate to the surface of the cathode assembly.

14. The plasma generator of claim 12 wherein at least one of a width of the gap and a flow rate of the volume of feed gas that is supplied by the gas source is chosen to increase a density of the plasma proximate to the surface of the cathode assembly.

15. The plasma generator of claim 12 wherein at least one of a width of the gap and a flow rate of the volume of feed gas that is supplied by the gas source is chosen to increase uniformity of the plasma proximate to the surface of the cathode assembly.

16. The plasma generator of claim 12 wherein a pressure in the gap is higher than a pressure proximate to the surface of the cathode assembly.

17. A plasma generator comprising:
   a. a cathode assembly that is positioned adjacent to an anode and forming a gap there between;
   b. an excited atom source that generates a volume of excited atoms from a volume of feed gas, the excited atom source supplying the volume of excited atoms to the gap between the cathode assembly and the anode; and
   c. a power supply that generates an electric field across the gap between the cathode assembly and the anode, the electric field ionizing the volume of excited atoms that is supplied to the gap, thereby creating a plasma in the gap.

18. The plasma generator of claim 17 wherein at least a portion of the volume of excited atoms comprises metastable atoms.

19. The plasma generator of claim 17 further comprising a gas flow controller that controls the volume of excited atoms supplied to the gap.

20. The plasma generator of claim 17 wherein a width of the gap is in the range of about 0.3 cm to 10 cm.

21. The plasma generator of claim 17 further comprising a magnet assembly that generates a magnet field that substantially traps electrons in the plasma.

22. The plasma generator of claim 17 wherein the cathode assembly comprises a hollow cathode comprising an inner surface that substantially surrounds the anode.

23. The plasma generator of claim 22 wherein the inner surface comprises a cylindrical wall.

24. The plasma generator of claim 17 wherein the plasma created in the gap diffuses proximate to a surface of the cathode assembly.

25. The plasma generator of claim 24 wherein the plasma is substantially uniformly-distributed proximate to the surface of the cathode assembly.

26. The plasma generator of claim 24 wherein at least one of a width of the gap and a flow rate of the volume of excited atoms that is supplied to the gap is chosen to increase a density of the plasma proximate to the surface of the cathode assembly.

27. The plasma generator of claim 24 wherein at least one of a width of the gap and a flow rate of the volume of excited atoms that is supplied to the gap is chosen to increase uniformity of the plasma proximate to the surface of the cathode assembly.

28. A method for generating a plasma, the method comprising:

a. supplying a volume of feed gas;

b. generating a volume of excited atoms from the volume of feed gas and supplying the volume of excited atoms to a gap between a cathode assembly and an anode; and c. applying an electric field across the gap, the electric field ionizing the volume of feed gas that is supplied to the gap, thereby creating a plasma in the gap.

29. The method of claim 28 further comprising adjusting a flow rate of the volume of feed gas supplied so as to increase a density of the plasma.

30. The method of claim 28 further comprising supplying a second volume of excited atoms that is generated from a second volume of feed gas, the second volume of excited atoms displacing the plasma.

31. The method of claim 28 wherein the applying the electric field across the gap comprises applying a quasi-static electric field across the gap.

32. The method of claim 28 wherein the applying the electric field across the gap comprises applying the electric field at a constant power.

33. The method of claim 28 wherein the applying the electric field across the gap comprises applying the electric field at a constant voltage.

34. The method of claim 28 wherein a peak plasma density of the plasma is in the range of about $10^7 cm^{-3}$ to $10^{16} cm^{-3}$.

35. The method of claim 28 further comprising generating a magnetic field proximate to the plasma, the magnetic field trapping electrons in the plasma, thereby increasing the density of the plasma.

36. The method of claim 35 wherein the magnetic field generated proximate to the plasma in the gap and the electric field applied across the gap intersect in the gap.

37. The method of claim 28 wherein the applying the electric field across the gap comprises applying a pulsed electric field across the gap.

38. The method of claim 37 further comprising selecting characteristics of the pulsed electric field to increase an ionization rate of the plasma.

39. The method of claim 37 wherein a rise time of the pulsed electric field is in the range of about 0.1 microsecond to 10 seconds.

40. The method of claim 28 wherein the plasma created in the gap diffuses proximate to a surface of the cathode assembly.

41. The method of claim 40 further comprising adjusting the flow rate of the volume of feed gas supplied so as to increase uniformity of the plasma proximate to the surface of the cathode assembly.

42. The method of claim 40 further comprising selecting a width of the gap to increase a density of the plasma proximate to the surface of the cathode assembly.

43. The method of claim 40 further comprising selecting a width of the gap to increase uniformity of the plasma proximate to the surface of the cathode assembly.

44. A method for generating a plasma, the method comprising:

a. generating a volume of excited atoms from a volume of feed gas;

b. supplying the volume of excited atoms to a gap between a cathode assembly and an anode; and c. applying an electric field across the gap, the electric field ionizing the volume of excited atoms that is supplied to the gap, thereby creating a plasma in the gap.

45. The method of claim 44 wherein at least a portion of the volume of excited atoms comprises metastable atoms.

46. The method of claim 44 further comprising supplying a second volume of excited atoms to the gap, the second volume of excited atoms displacing the plasma.

47. The method of claim 44 wherein the plasma created in the gap diffuses proximate to a surface of the cathode assembly.

48. The method of claim 47 further comprising adjusting a flow rate of the volume of excited atoms to increase a density of the plasma proximate to the surface of the cathode assembly.

49. The method of claim 47 further comprising adjusting the flow rate of the volume of excited atoms to increase uniformity of the plasma proximate to the surface of the cathode assembly.

50. A plasma generator comprising:

a. means for generating a volume of excited atoms from a volume of feed gas;

b. means for supplying the volume of excited atoms to a gap between a cathode assembly and an anode; and c. means for applying an electric field across the gap, the electric field ionizing the volume of excited atoms that is supplied to the gap, thereby creating a plasma in the gap.

* * * * *

UNITED STATES PATENT AND TRADEMARK OFFICE
CERTIFICATE OF CORRECTION

PATENT NO.     : 6,903,511 B2
DATED          : June 7, 2005
INVENTOR(S)    : Chistyakov It is certified that error appears in the above-identified patent and that said Letters Patent is hereby corrected as shown below:

Column 17,
Line 41, replace "volume of excited gas atoms" with -- volume of excited atoms --.

Signed and Sealed this

Sixteenth Day of August, 2005

JON W. DUDAS
*Director of the United States Patent and Trademark Office*